United States Patent
Tubera et al.

(10) Patent No.: US 6,549,025 B1
(45) Date of Patent: Apr. 15, 2003

(54) SYSTEM AND METHOD FOR THERMAL TESTING OF CIRCUIT BOARDS USING THERMAL FILMS

(75) Inventors: Benjamin G. Tubera, Milpitas, CA (US); Rafiqul Hussain, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 8 days.

(21) Appl. No.: 09/610,872

(22) Filed: Jul. 6, 2000

(51) Int. Cl.$^7$ ................................. G01R 31/02
(52) U.S. Cl. .................. 324/760; 324/158.1; 174/252; 361/713
(58) Field of Search .................. 324/754, 755, 324/760, 765, 104, 105, 158.1; 349/199; 174/250, 252, 256, 258, 260; 361/158, 211, 713; 438/13, 14, 54, 55; 257/48, 625

(56) References Cited

U.S. PATENT DOCUMENTS

| | | | | |
|---|---|---|---|---|
| 4,682,857 A | * | 7/1987 | Tang | 349/199 |
| 5,541,524 A | * | 7/1996 | Tuckerman | 324/754 |
| 5,673,028 A | * | 9/1997 | Levy | 340/635 |
| 6,127,833 A | * | 10/2000 | Wu | 324/755 |
| 6,335,629 B1 | * | 1/2002 | Lee | 324/755 |

* cited by examiner

*Primary Examiner*—Kamand Cuneo
*Assistant Examiner*—Trung Nguyen

(57) ABSTRACT

A burn-in board and a method for thermally testing the burn-in board determines if the burn-in board is defective. The burn-in board includes components on a front side of the burn-in board and thermal tape on the back side of the burn-in board. Power and ground are supplied to the burn-in board and the thermal tape changes color indicating a hot spot if the burn-in board contains one or more problem areas.

9 Claims, 4 Drawing Sheets

SYSTEM AND METHOD FOR THERMAL TESTING OF CIRCUIT BOARDS USING THERMAL FILMS

FIELD OF THE INVENTION

The present invention relates to a system and method for thermal testing of circuit boards using thermal films. The present invention has particular applicability in thermal testing of burn-in boards, as well as integrated circuit (IC) sockets and components on the burn-in boards.

BACKGROUND ART

Burn-in boards are used to test semiconductor devices, such as integrated circuit (IC) chips, to ensure that the semiconductor devices are operating in a proper manner. Typically, the semiconductor device to be tested is inserted into a socket mounted on a burn-in board. For example, an IC chip is inserted into an IC socket on a burn-in board. The burn-in board is then placed in a testing chamber and power, ground and test signals are coupled to the burn-in board. The semiconductor devices in the IC socket are then tested for a period of time under stress conditions to ensure that the semiconductor devices are performing according to set standards or specifications.

In order to accurately test if a semiconductor device is working in a proper manner, the burn-in board and the components on the burn-in board must be working in a proper manner. For example, if a socket on the burn-in board contains a short or an open, then the semiconductor device inserted into the defective socket can be damaged. Although, semiconductor devices are less expensive then in the past, it is more cost efficient to replace a defective burn-in board than risk damaging one or more semiconductor devices due to a defective burn-in board. Therefore, prior to testing one or more semiconductor devices on a burn-in board, the burn-in board and sockets on the burn-in board should be tested first.

Presently, a burn-in board and the sockets on a burn-in board are tested using a test probe. Specifically, a test probe is inserted into a socket on the burn-in board. Testing in such a manner, however, is expensive, time-consuming and reduces the life of a socket. The test probes themselves are expensive and different test probes are required for different sockets. Moreover, the sockets can only be tested one at a time. As a result, it takes approximately 15–20 minutes to test a burn-in board having 24 sockets. Moreover, every time a test probe is inserted into a socket, the connections for the socket are worn and the life of the socket is reduced. Furthermore, a socket can be damaged when the test probe is removed thereby risking damage to the semiconductor device which is inserted into the damaged socket.

There exists a need for a simplified and efficient methodology for testing burn-in boards which reduces the number of testing steps, thereby reducing manufacturing costs and increasing production throughput.

There also exists a need for a simplified and efficient system for testing burn-in boards which reduces the amount of equipment to test the burn-in board, thereby reducing manufacturing costs and increasing production throughput.

SUMMARY OF THE INVENTION

These and other needs are met by embodiments of the present invention which provide a method of efficiently testing whether a burn-in board and the components on the burn-in board are operating in a proper manner by placing thermal tape on the back side of the burn-in board. Power and ground are applied to the burn-in board. The thermal tape indicates one or more hot spots, thus indicating a defective socket or device on a burn-in board.

The circuit board of the present invention includes at least one ground connection, at least one power connection and thermal tape attached to the circuit board, wherein the thermal tape indicates a hot spot on the circuit board when power and ground are connected to the circuit board. Using the thermal tape on the circuit board allows for an efficient manner for determining if the circuit board and the components on the circuit board are operating properly.

A method of the present invention is for testing a circuit board. The method includes the steps of applying power and ground to the circuit board and determining locations of hot spots on the circuit board. Applying the power and ground to the circuit board allows for the detection of the hot spots.

Another method of the present invention is also for testing a circuit board. The method includes the steps of applying thermal tape on a circuit board and supplying power and ground to the circuit board, wherein the thermal tape changes colors indicating a hot spot on the circuit board. The thermal tape provides an efficient and cost efficient manner to determine if the circuit board or components on the circuit board are operating properly.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies and systems for testing burn-in boards are inefficient, expensive, and time consuming. Typically, sockets on a burn-in board are individually tested using expensive test probes. Moreover, every time a socket is tested, the connections for the socket are worn and reduce the life of the socket. The present invention addresses and solves these problems stemming from conventional testing of burn-in boards.

According to the methodology of the present invention, by placing thermal tape on the back side of a burn-in board to indicate hot spots, the burn-in board can be tested in an efficient manner to ensure that the burn-in board and components on the burn-in board are working properly. Moreover, the sockets on the burn-in board are tested in a non-intrusive manner, thereby reducing the risk of damage to the sockets. Once the burn-in board is tested, semiconductor devices can be inserted into the sockets on the burn-in board, thereby allowing the semiconductor devices to be tested.

Figure 1:
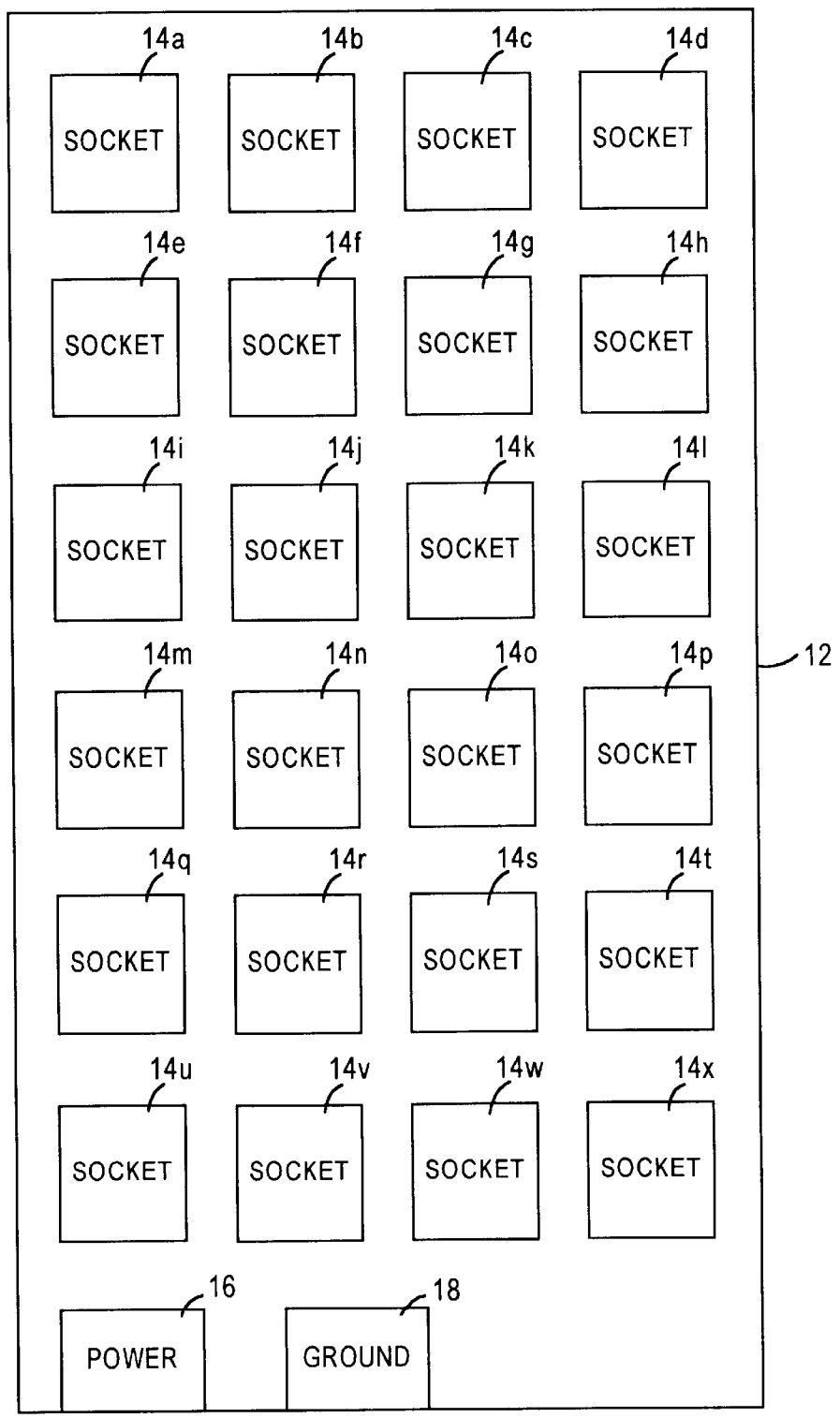
FIG. 1 is a top view of an exemplary burn-in board in accordance with an embodiment of the present invention.
Figure 2:
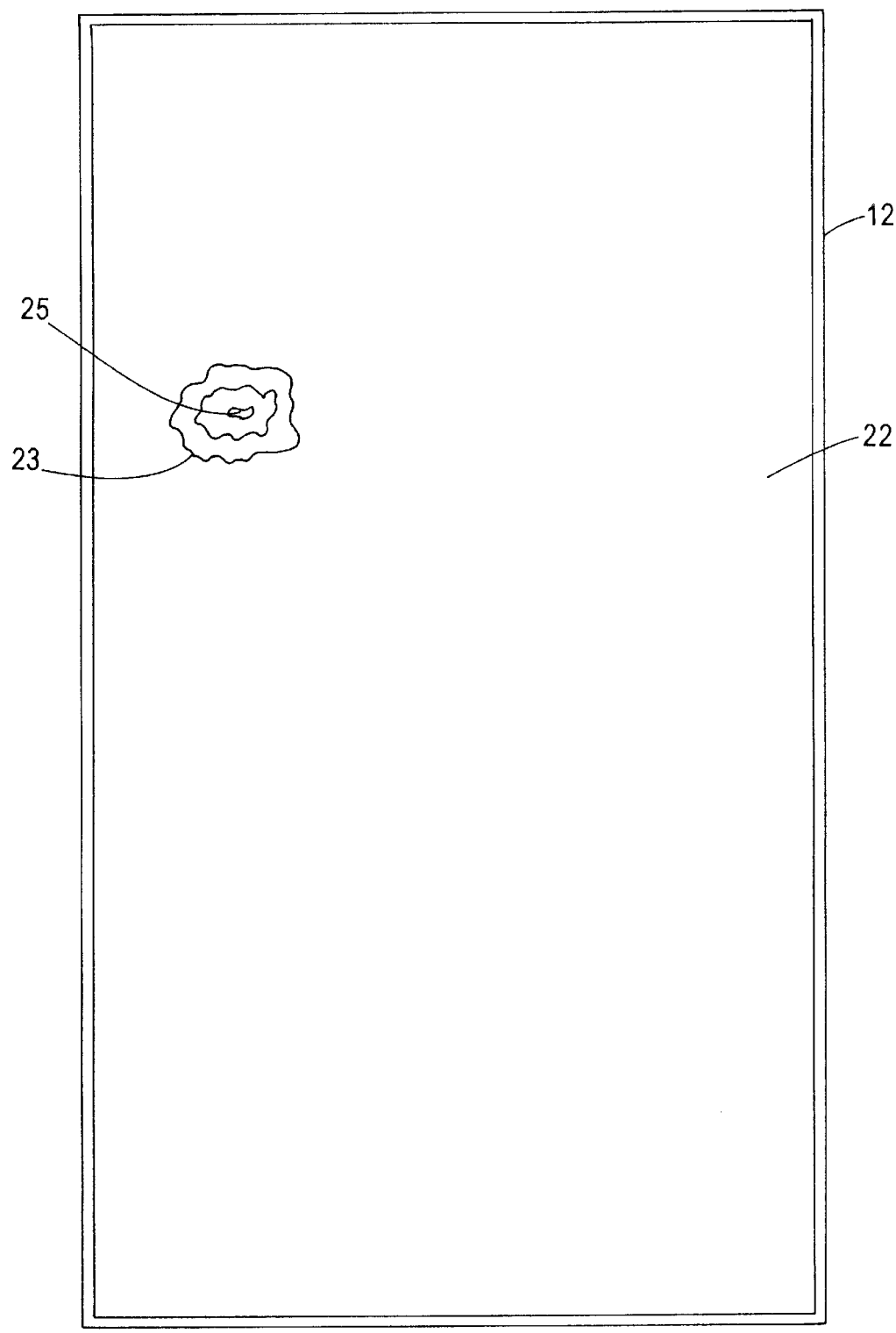
FIG. 2 is a bottom view of an exemplary burn-in board having thermal tape on the back side of the burn-in board in accordance with an embodiment of the present invention.

Referring to FIGS. 1 and 2, the top and bottom views of an exemplary circuit board having one or more sockets are illustrated. The exemplary circuit board 12 is a burn-in board 12 having twenty-four (24) IC sockets 14a–x, however, in alternate embodiments, the burn-in board 12 can include a different number of sockets, as well as sockets being of different types and sizes. Power and ground are connected to at least one power edge connector 16 and at least one ground edge connector 18 as known in the art. Typically, the burn-in board 12 is a circuit board, e.g., a fatherboard, which plugs into a motherboard. Power and ground are connected to each IC socket 14 through traces which are located on one or more layers of the burn-in board 12 as known in the art. In addition to the IC sockets 14a–x, the burn-in board 12 can include components, such as resistors, capacitors or other electrical components (not shown).

As illustrated in FIG. 2, a piece of thermal tape 22 is attached to the bottom or back side of the burn-in board 12. Thermal tape or film 22 is well known, and provides an accurate indication of temperature. Thermal tape 22 typically comes in rolls in which the tape can be tailored to fit on the back side of a burn-in board 12. Thermal tape 22 changes colors according to the intensity of heat. Therefore, certain changes in the color indicate a defective area or areas on the burn-in board 12. For example, an IC socket 14 containing a short would have a hot spot 23 where the short is located. At the back side of the burn-in board 12, the area where the hot spot 23 is located would include several colors showing the different levels of heat, with the center 25 of the hot spot 23 being the hottest spot. Therefore, a hot spot provides a visual indication of a problem area or areas on a burn-in board as these areas are experiencing excessive power dissipation. Knowing where the problem area or areas in such an efficient manner not only not saves time but also allows the tester to readily pinpoint the cause of the problem.

Figure 3:
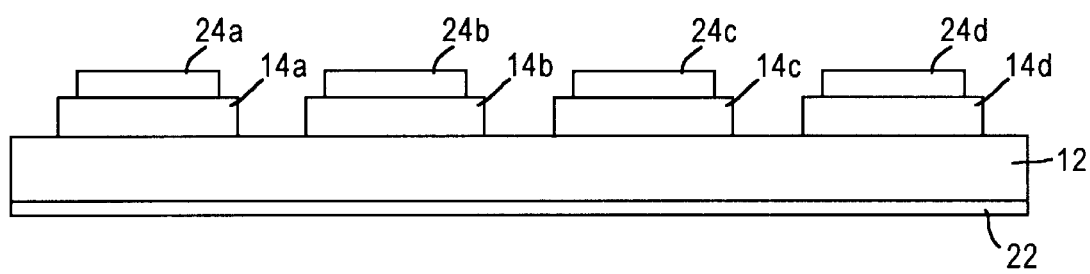
FIG. 3 is a side view of an exemplary burn-in board in accordance with an embodiment of the present invention.

Referring to FIG. 3, a side view of an exemplary burn-in board is provided. As illustrated, the burn-in board 12 includes thermal tape 22 on the back side of the burn-in board 12 for indicating hot spots. Sockets 14a, 14b, 14c, and 14d are mounted on the front side of the burn-in board 12. Once the burn-in board 12 is tested for hot spots, integrated circuit (IC) chips 24a, 24b, 24c, and 24d can be inserted into sockets 14a, 14b, 14c, and 14d, respectively.

Figure 4:
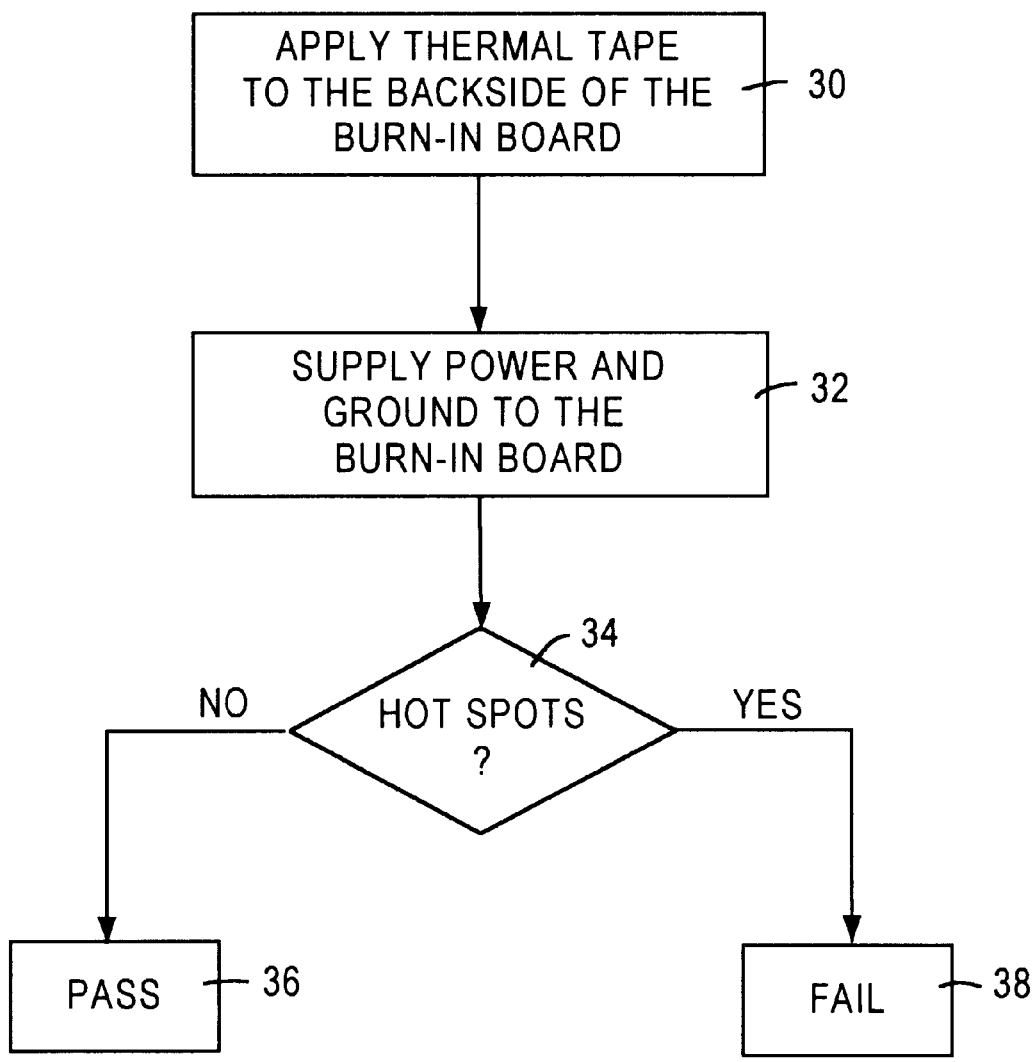
FIG. 4 is a flow diagram illustrating the steps of testing a burn-in board in accordance with an embodiment of the present invention.

Referring to FIG. 4, the steps of testing a burn-in board 12 in accordance with embodiments of the present invention are illustrated. At step 30, thermal tape 22 is applied to the back side of a burn-in board 12. If a burn-in board 12 already has thermal tape 22 applied to the back side, the thermal tape can be replaced or used again. At step 32, power and ground are supplied to the burn-in board 12 through edge connectors 16, 18, respectively. At step 34, the burn-in board 12 is observed to determine if the thermal tape 22 indicates any hot spots. If there are no hot spots, then the burn-in board 12 passed the tests and the sockets 14 and burn-in board 12 is deemed to be operating in a proper manner at step 36. If a hot spot is indicated, then the burn-in board 12 failed the test and appropriate action is required at step 38. For example, an appropriate action can be to discard the burn-in board 12, replace a component on the burn-in board 12, or simply not to use the defective socket 14.

The present invention provides a system and method for testing burn-in boards in a simplified and an efficient manner. Thermal tape is applied to the back side of a burn-in board and power and ground are provided to the board. The thermal tape is used to efficiently test and identify a problem area or areas of the burn-in board, thereby allowing appropriate action to be taken to alleviate the problem without risking damage to a socket and preventing damage to a semiconductor device inserted into the defective socket on the burn-in board for testing.

Similarly, in alternate embodiment, the back side of the circuit board can be thermally imaged using a thermal imaging camera and observing color changes due to temperature differences upon applying power and ground to the circuit board. In yet another embodiment, temperature sensitive chemicals are applied to the back side of the circuit board. The chemicals change colors when the temperature reaches a specified temperature upon applying power and ground.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A circuit board comprising:
   a front side;
   a back side;
   at least one ground connection;
   at least one power connection; and
   thermal tape attached to the back side of the circuit board, wherein the thermal tape indicates a hot spot on the back side of the circuit board when power and ground are connected to the circuit board signifying a problem area on the front side of the circuit board.

2. The circuit board of claim 1, wherein the circuit board is a burn-in board.

3. The circuit board of claim 1, further comprising at least one socket on the front side of the circuit board.

4. The circuit board of claim 3, wherein the at least one socket is an integrated circuit socket.

5. The circuit board of claim 1, wherein the circuit board is a fatherboard.

6. The circuit board of claim 5, wherein the at least one ground connection is an edge connector.

7. The circuit board of claim 5, wherein the at least one power connection is an edge connector.

8. A method for testing a circuit board, comprising the steps of:

applying thermal tape that changes color according to temperature to the back side of the circuit board;

applying power and ground to the circuit board; and observing the color changes upon applying said power and ground to determine locations of hot spots signifying a problem area on the front side of the circuit board.

9. A method for testing a circuit board, comprising the step of:

thermal imaging a back side of the circuit board; and observing the color changes upon applying power and ground to determine locations of hot spots signifying a problem area on a front side of the circuit board.

* * * * *